(12) United States Patent
Chen et al.

(10) Patent No.: US 6,187,674 B1
(45) Date of Patent: Feb. 13, 2001

(54) MANUFACTURING METHOD CAPABLE OF PREVENTING CORROSION AND CONTAMINATION OF MOS GATE

(75) Inventors: Tung-Po Chen, Taichung; Yung-Chang Lin, Feng-Yuan; Keh-Ching Huang; Jacob Chen, both of Hsinchu, all of (TW)

(73) Assignee: United Microelectronics Corp., Hsinchu (TW)

( * ) Notice: Under 35 U.S.C. 154(b), the term of this patent shall be extended for 0 days.

(21) Appl. No.: 09/208,605

(22) Filed: Dec. 8, 1998

(51) Int. Cl.$^7$ .................................................. H01L 21/44
(52) U.S. Cl. .................... 438/653; 438/301; 438/303; 438/595
(58) Field of Search .................... 438/257, 262, 438/263, 264, 265, 301, 303, 305, 306, 307, 509, 530, 583, 595, 649, 653, 663

(56) References Cited

U.S. PATENT DOCUMENTS

| | | | |
|---|---|---|---|
| 5,288,666 | * | 2/1994 | Lee ........................................ 438/299 |
| 5,597,745 | * | 1/1997 | Byun et al. ........................... 438/301 |
| 5,597,983 | * | 1/1997 | Nguyen et al. ....................... 174/264 |
| 5,705,428 | * | 1/1998 | Liu et al. .............................. 438/643 |
| 5,776,823 | * | 7/1998 | Agnello et al. ....................... 438/592 |
| 5,811,851 | * | 9/1998 | Nishioka et al. ..................... 257/310 |
| 5,874,353 | * | 2/1999 | Lin et al. ............................... 438/592 |
| 5,956,608 | * | 9/1999 | Khurana et al. ...................... 438/627 |
| 5,972,804 | * | 10/1999 | Tobin et al. .......................... 438/786 |
| 6,020,024 | * | 2/2000 | Maiti et al. ........................... 427/248 |

FOREIGN PATENT DOCUMENTS

794716 * 4/1995 (JP).

* cited by examiner

*Primary Examiner*—Charles Bowers
*Assistant Examiner*—Jack Chen
(74) *Attorney, Agent, or Firm*—Hickman Coleman & Hughes, LLP

(57) ABSTRACT

A MOS gate manufacturing operation is capable of preventing acid corrosion and station contamination. The manufacturing method includes the steps of sequentially forming a polysilicon layer, a barrier layer, a silicide layer and a cap layer over a silicon substrate, and then etching to form a gate structure. Next, a rapid thermal process is carried out to form an oxide layer over the exposed sidewalls of the barrier layer. Finally, the substrate is cleaned following by the formation of a source/drain region having a lightly doped drain structure on each side of the gate. The thin oxide layer is capable of protecting the barrier layer against acid corrosion without causing any noticeable increase in gate conductivity.

19 Claims, 4 Drawing Sheets

US 6,187,674 B1

MANUFACTURING METHOD CAPABLE OF PREVENTING CORROSION AND CONTAMINATION OF MOS GATE

BACKGROUND OF THE INVENTION

1. Field of Invention

The present invention relates to a manufacturing method capable of preventing the corrosion and contamination of a MOS gate. More particularly, the present invention relates to a manufacturing method that uses a rapid thermal process to form a protective oxide layer over part of the MOS gate capable of preventing corrosion and contamination during subsequent etching operations.

2. Description of Related Art

Metal-oxide-semiconductor (MOS) transistor is an important semiconductor device in an integrated circuit. The MOS transistor acts like a switch that can be switched ON or OFF through its gate. Since the gate is a major component in the operation of the MOS device, any deviation in the gate's voltage sensitivity can lead to serious control problems.

FIGS. 1A through 1C are schematic, cross-sectional views showing the progression of manufacturing steps according to a conventional method of producing a MOS device. First, as shown in FIG. 1A, a gate oxide layer 12 is formed over a silicon substrate 10. Then, a polysilicon layer 13 is deposited over the gate oxide layer 12. Next, a barrier layer 14 is formed over the polysilicon layer 13. The barrier layer 14 can be used to prevent the cross-diffusion of different type ions inside the polysilicon layer 13. For example, in a dual gate MOS transistor, the P-type ions in the P-type gate and the N-type ions in the N-type gate can diffuse into each other. Thereafter, a silicide layer 15 and then a cap layer 16 are deposited in sequence over the barrier layer 14.

Next, as shown in FIG. 1B, photolithographic and etching operations are conducted to pattern a gate region. Subsequently, using the cap layer 16 as a mask, a first ion implantation is carried out, implanting ions into the substrate to form lightly doped source/drain regions 17.

Thereafter, as shown in FIG. 1C, spacers 18 are formed on the sidewalls of the gate. Finally, using the gate and the spacers 18 as masks, a second ion implantation is carried out implanting ions into the substrate again to form heavily doped source/drain regions 11.

In general, the barrier layer 14 is formed using titanium material such as titanium nitride. However, titanium nitride is vulnerable to acid attack in subsequent operation whenever the gate sidewall is exposed, thereby easily contaminating manufacturing stations. FIG. 2 is a cross-sectional view indicating the position of corrosion 19 on the sidewalls of a barrier layer in a MOS gate.

In light of the foregoing, there is a need to improve the method for manufacturing MOS gate.

SUMMARY OF THE INVENTION

Accordingly, the present invention provides a method for manufacturing MOS gate capable of preventing acid corrosion and station contamination through the exposure of its barrier layer. The method includes performing a rapid thermal treatment to form a protective oxide layer over the barrier layer.

To achieve these and other advantages and in accordance with the purpose of the invention, as embodied and broadly described herein, the invention provides a method for manufacturing a MOS gate capable of preventing acid corrosion and station contamination. The manufacturing method includes the steps of sequentially forming a polysilicon layer, a barrier layer, a silicide layer and a cap layer over a silicon substrate, and then etching to form a gate structure. Next, a rapid thermal process is carried out to form an oxide layer over the exposed sidewalls of the barrier layer. Finally, the substrate is cleaned following by the formation of a source/drain region having a lightly doped drain structure on each side of the gate.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
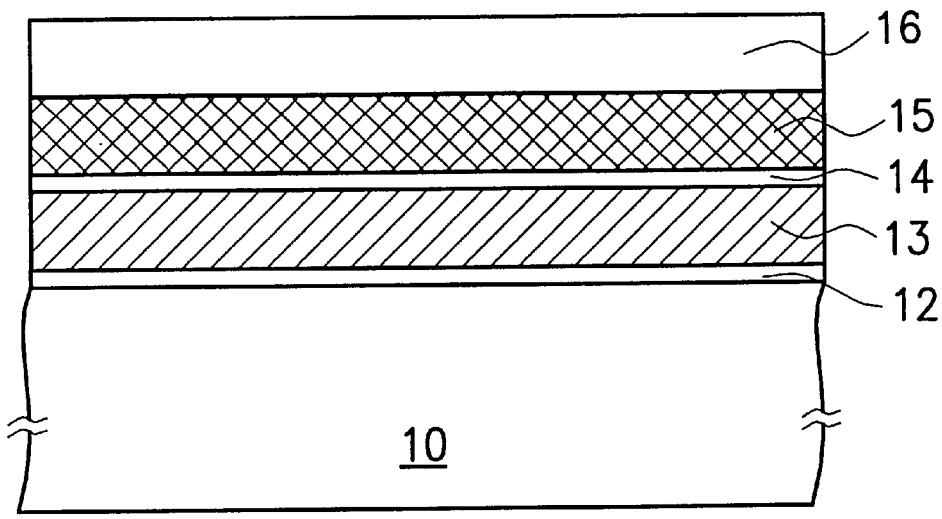
FIGS. 1A through 1C are schematic, cross-sectional views showing the progression of manufacturing steps according to a conventional method of producing a MOS device.
Figure 1B:
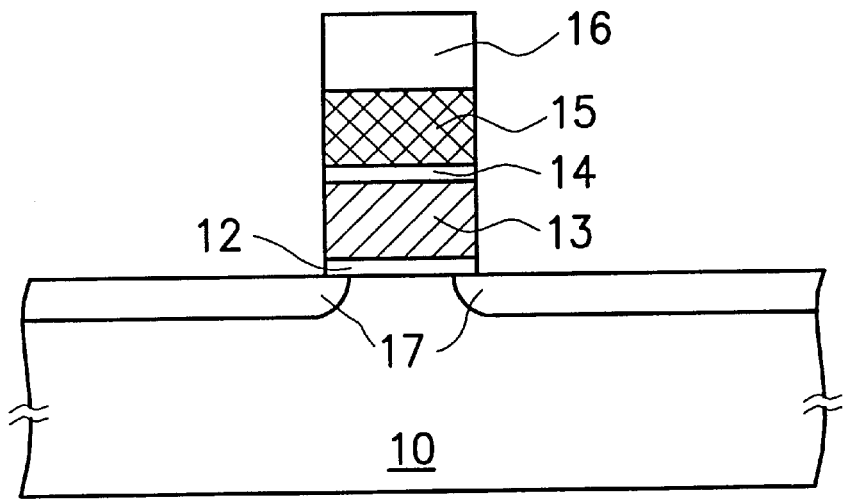
Figure 1C:
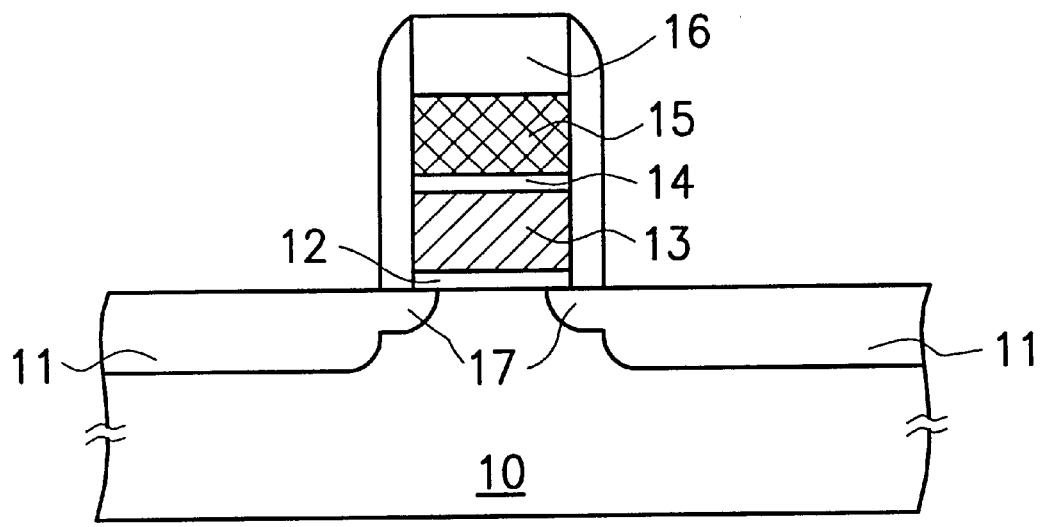
Figure 2:
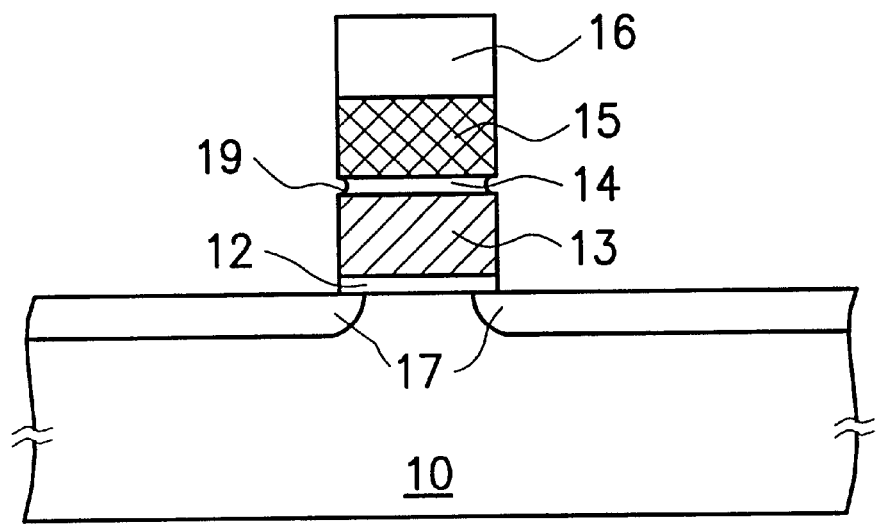
FIG. 2 is a schematic, cross-sectional view indicating the position of corrosion on the sidewalls of a barrier layer in a MOS gate.

Reference will now be made in detail to the present preferred embodiments of the invention, examples of which are illustrated in the accompanying drawings. Wherever possible, the same reference numbers are used in the drawings and the description to refer to the same or like parts.

Figure 3A:
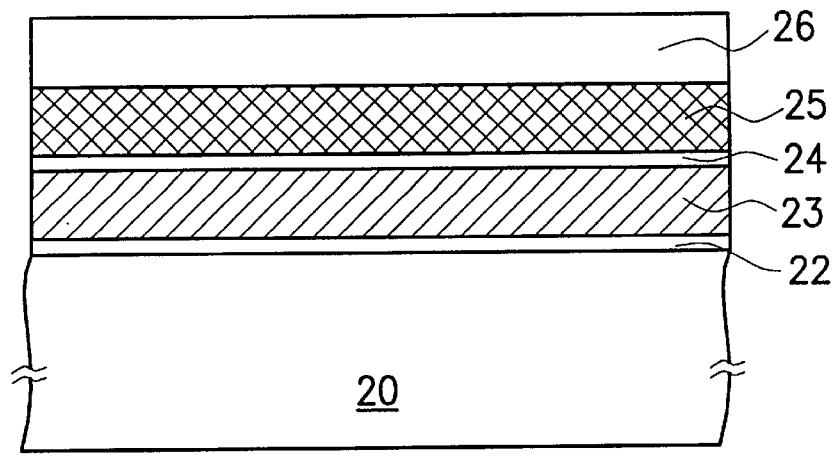
FIGS. 3A through 3C are schematic, cross-sectional views showing the progression of manufacturing steps for fabricating a MOS device according to the preferred embodiment of this invention.
Figure 3B:
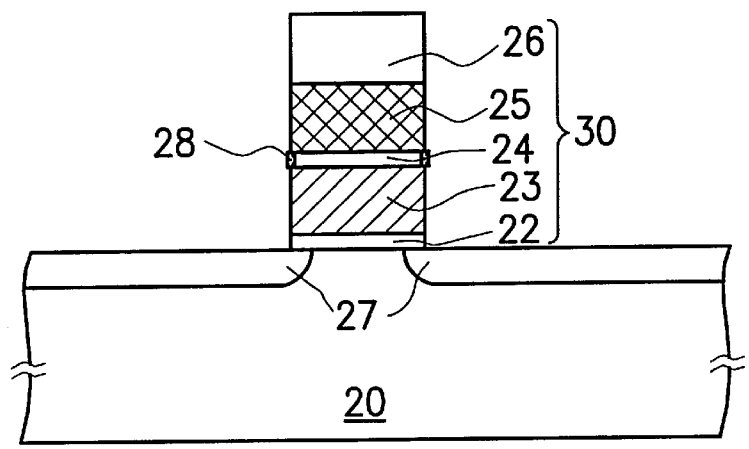
Figure 3C:
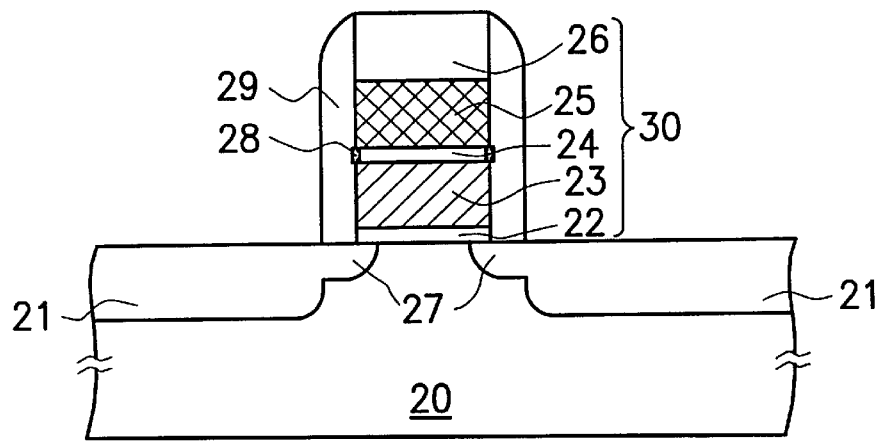
Figure 4:
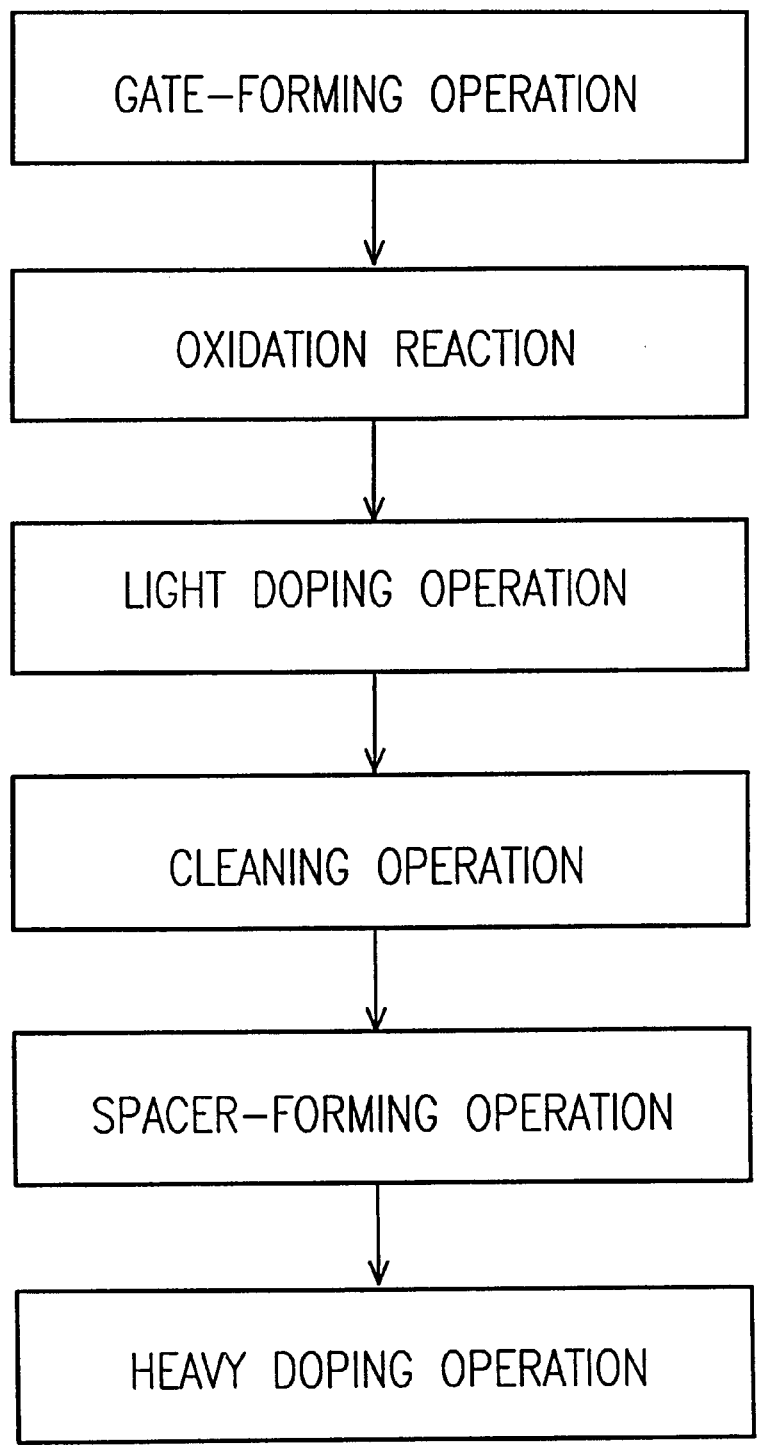
FIG. 4 is a flow chart showing the steps in manufacturing a MOS device according to this invention.

FIGS. 3A through 3C are schematic, cross-sectional views showing the progression of manufacturing steps for fabricating a MOS device according to the preferred embodiment of this invention. FIG. 4 is a flow chart showing the steps in manufacturing a MOS device according to this invention.

First, as shown in FIGS. 3A and 4, a gate oxide layer 22 having a thickness of between about 20 Å to 300 Å is formed over a silicon substrate 20. The gate oxide layer 22 can be directly grown over the substrate 20 using a thermal oxidation method. Then, a polysilicon layer 23 having a thickness of between about 1000 Å to 2000 Å is formed over the gate oxide layer 22. The polysilicon layer 23 can be formed using a chemical vapor deposition (CVD) method. Next, a barrier layer 24 is formed over the polysilicon layer 23 using, for example, a chemical vapor deposition (CVD) method. The barrier layer 24 can be used to prevent the cross-diffusion of different type ions inside the polysilicon layer 23. For example, in a dual gate MOS transistor, the P-type ions in the P-type gate and the N-type ions in the N-type gate can diffuse into each other. In general, there is no restriction as to the thickness of the barrier layer 24 as long as cross-diffusion of ions can be prevented. Normally, a barrier layer having a thickness of between about 50 Å to 100 Å is sufficient. Thereafter, a silicide layer 25 having a thickness of between about 300 Å to 1500 Å is formed over the barrier layer 24. Then, a cap layer 26 that is slightly thicker than the silicide layer 25 are deposited over the silicide layer 25. The silicide layer 25 can be a titanium silicide layer, or a tungsten silicide layer, or a molybdenum silicide layer formed using a physical vapor deposition (PVD) such as a sputtering method or a chemical vapor deposition (CVD) method. The cap layer 26 can be a silicon nitride layer formed similarly using a chemical vapor deposition (CVD) method.

Next, as shown in FIGS. 3B and 4, photolithographic and etching operations are conducted to pattern a gate structure 30. Thereafter, the MOS device undergoes a rapid thermal processing (RTP) operation. The RTP is carried out in an oxygen-filled atmosphere. The substrate 20 is heated to a temperature of between about 400° C. to 850° C. and remains there for about 10 to 60 seconds. Consequently, thin oxide layers 28 having a thickness of between about 50 Å to 150 Å are formed on the sidewalls of the exposed barrier layer 24. If the barrier layer is a titanium nitride layer, then the thin oxide layer is a titanium oxide layer with the composition (Ti—N—O). Since the barrier layer has an overall width of about 0.25 µm, the thickness of the thin oxide layer is relatively small. Hence, conductivity of the MOS gate is little affected by the formation of the thin oxide layers 28. Subsequently, using the cap layer 26 as a mask, a first ion implantation is carried out, implanting ions into the substrate 20 on each side of the gate structure 30 to form lightly doped source/drain regions 27. After that, unwanted thin polymer layer over the substrate 20 formed in previous deposition operations is removed through an etch-cleaning operation. The thin oxide layers 28 on the sidewalls of the barrier layer 24 serves as a barrier blocking any contaminants from leaving through acid corrosion.

Next, as shown in FIGS. 3C and 4, a thick oxide layer (not shown) is deposited over the substrate 20 and the gate structure 30. Then, the thick oxide layer is etched back to form spacers 29 on the sidewalls of the gate structure 30. Finally, using the gate and the spacers 29 as a mask, a second ion implantation is carried out, implanting ions into the substrate again to form heavily doped source/drain regions 21. The lightly doped source/drain regions 27 and the heavily doped source/drain region 21 together constitute a lightly doped drain (LDD) structure. In the aforementioned illustration, ion implantation is conducted twice to form the LDD structure. However, if the LDD structure is not required, then just one implantation is needed to form the source/drain region. In that case, the RTP operation can be carried out before the single ion implantation.

In summary, the invention employs a rapid thermal processing operation to form an oxide layer over the exposed sidewalls of the barrier layer. The thin oxide layer does not cause any observable increase in MOS gate conductivity because it occupies only a tiny fraction of area at the periphery of the barrier layer. Nevertheless, the thin oxide layer is capable of protecting the barrier layer against acid corrosion during subsequent etching operations.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a MOS gate wherein corrosion and contamination are prevented, comprising:
   providing a silicon substrate;
   forming a gate oxide layer over the substrate;
   forming a polysilicon layer over the gate oxide layer;
   forming a barrier layer over the polysilicon layer;
   forming a suicide layer over the barrier layer;
   forming a cap layer over the silicide layer;
   etching the cap layer, the silicide layer, the barrier layer, the polysilicon layer and the gate oxide layer to form a gate structure;
   performing a rapid thermal process to form a titanium nitride oxide layer on side walls of the barrier layer;
   performing a first ion doping, which is used to form a lightly doped region in the substrate; and
   performing a cleaning operation of the substrate.

2. The method of claim 1, wherein the step of forming the barrier layer includes depositing titanium nitride.

3. The method of claim 1, wherein the step of performing the rapid thermal process includes heating to a temperature of between about 400° C. to 850° C.

4. The method of claim 1, wherein the step of performing the rapid thermal process includes carrying out the rapid thermal process for about 10 to 60 seconds.

5. The method of claim 1, wherein the step of forming the silicide layer includes depositing tungsten silicide.

6. The method of claim 1, wherein the titanium nitride oxide layer has a thickness of between about 50 Å to 150 Å.

7. The method of claim 2, wherein the titanium nitride oxide layer has a thickness of between about 50 Å to 150 Å.

8. The method of claim 1 further including after performing the cleaning operation of the substrate:
   forming a spacer on a sidewall of the gate structure; and
   performing a second ion doping, which is used to form a heavily doped source/drain region in the substrate.

9. A method for preventing corrosion of a gate structure during manufacture, comprising:
   providing a silicon substrate;
   forming a gate structure on the substrate, wherein the gate structure includes a gate oxide layer over the substrate, a polysilicon layer over the gate oxide layer, a titanium nitride layer over the polysilicon layer, a silicide layer over the titanium nitride layer, and a cap layer over the silicide layer;
   forming a titanium nitride oxide film on an exposed side-wall of the titanium nitride layer by way of a rapid thermal process, the titanium nitride oxide film serving as a barrier for preventing acid corrosion during subsequent etching operations;
   forming a lightly doped region in the substrate; and
   performing a cleaning process on the substrate.

10. The method of claim 9 further including after performing a cleaning process on the substrate:
    forming a spacer on a side-wall of the gate structure; and
    forming a heavily doped source/drain region in the substrate.

11. The method of claim 9, wherein the rapid thermal process comprises heating to a temperature of between about 400° C.–850° C.

12. The method of claim 9, wherein the rapid thermal process is carried out for about 10–60 seconds.

13. A method for preventing contamination of a manufacturing station, comprising:
    providing a silicon substrate;
    forming a gate structure on the substrate, wherein the gate structure includes a gate oxide layer over the substrate, a polysilicon layer over the gate oxide layer, a titanium nitride layer over the polysilicon layer, a silicide layer over the titanium nitride layer, and a cap layer over the silicide layer;

forming a titanium nitride oxide film on an exposed side-wall of the titanium nitride layer by way of a rapid thermal process, the titanium nitride oxide film serving as a barrier for preventing contaminants from entering the manufacturing station through acid corrosion;

forming a lightly doped region in the substrate; and performing a cleaning process on the substrate.

14. The method of claim 13 further including after performing a cleaning process on the substrate:

forming a spacer on a side-wall of the gate structure; and forming a heavily doped source/drain region in the substrate.

15. The method of claim 13, wherein the rapid thermal process comprises heating to a temperature of between about 400° C.–850° C.

16. The method of claim 13, wherein the rapid thermal process is carried out for about 10–60 seconds.

17. A fabrication method for a MOS gate, wherein problems of corrosion and contamination are prevented, comprising:

forming a gate structure on a substrate, wherein the gate structure comprises at least a polysilicon layer and a titanium nitride barrier layer;

performing a rapid thermal process at a temperature of about 400 to 850 degrees Celsius for about 10 to 60 seconds to form a titanium nitride oxide layer of about 50 to 150 angstroms thick on a sidewall of the titanium nitride barrier layer;

forming a lightly doped region in the substrate;

forming a spacer on a sidewall of the gate structure; and forming a heavily doped source/drain region in the substrate.

18. The method of claim 9 wherein said rapid thermal process forms a titanium nitride oxide film on the exposed sidewall of the titanium nitride layer to a thickness in the range about 50 to 150 angstroms.

19. The method of claim 13 wherein said rapid thermal process forms a titanium nitride oxide film on the exposed sidewall of the titanium nitride layer to a thickness in the range about 50 to 150 angstroms.

* * * * *